United States Patent [19]

Sasaki et al.

[11] 4,425,700
[45] Jan. 17, 1984

[54] SEMICONDUCTOR DEVICE AND METHOD FOR MANUFACTURING THE SAME

[75] Inventors: Nobuo Sasaki, Kawasaki; Motoo Nakano, Yokohama, both of Japan

[73] Assignee: Fujitsu Limited, Kawasaki, Japan

[21] Appl. No.: 290,972

[22] Filed: Aug. 7, 1981

[30] Foreign Application Priority Data

Aug. 13, 1980 [JP] Japan ................. 55-111334

[51] Int. Cl.³ .................. H01L 21/86; H01L 21/88
[52] U.S. Cl. ...................... 29/571; 29/578; 29/580; 29/590; 148/175; 357/23; 357/67; 357/71; 427/84; 427/88; 427/91; 427/255.4
[58] Field of Search .............. 29/576 T, 590, 578, 29/580, 571; 148/175; 427/84, 88, 91, 255.4; 357/23 TF, 67, 71, 67 S, 71 S, 4

[56] References Cited

U.S. PATENT DOCUMENTS

| 3,749,614 | 7/1973 | Boleky et al. | 148/188 |
| 3,753,774 | 8/1973 | Veloric | 427/84 |
| 3,777,364 | 12/1973 | Schinella et al. | 29/590 X |
| 4,080,719 | 3/1978 | Wilting | 29/578 X |
| 4,102,733 | 7/1978 | De La Moneda et al. | 29/571 X |
| 4,276,688 | 7/1981 | Hsu | 357/4 X |
| 4,336,550 | 6/1982 | Medwin | 357/4 X |

FOREIGN PATENT DOCUMENTS 53-17393 6/1978 Japan ............... 357/71 S

OTHER PUBLICATIONS

Kircher et al., "Interconnection Method for Integrated Circuits", I.B.M. Tech. Discl. Bull., vol. 13, No. 2, Jul. 1970, p. 436.

*Primary Examiner*—W. G. Saba
*Attorney, Agent, or Firm*—Staas & Halsey

[57] ABSTRACT

The method of manufacture of a semiconductor device having wirings or electrodes of silicide formed by: exposing parts of a single-crystal silicon layer formed on an insulating substrate, forming a film of metal over the exposed parts, and annealing so that a silicide is formed of the silicon and metal throughout the entire thickness of the silicon layer. The single-crystal silicon layer may be formed on a sapphire or spinel substrate having a film of silicon dioxide, sapphire or spinel, epitaxially grown on a silicon substrate.

8 Claims, 11 Drawing Figures

SEMICONDUCTOR DEVICE AND METHOD FOR MANUFACTURING THE SAME

BACKGROUND OF THE INVENTION

1. Field of the Invention

This invention is directed to a method of manufacturing a semiconductor device, and more particularly to a method including the steps of exposing a part of a single-crystal or polycrystalline silicon layer formed on an insulating substrate, depositing a film of metal over said silicon layer and annealing to form silicide of the metal for the purpose of lowering the resistance of the single-crystal or polycrystalline silicon layer which is then used as interconnection wirings or electrodes.

2. Description of the Prior Art

Multiple wiring layers have recently been used to increase the integration density of integrated circuits. Referring to FIG. 1A, there is formed a first wiring 2 of aluminum, for example on an insulating substrate 1. An insulating layer of phospho-silicate-glass (PSG) 3 is formed over the aluminum wiring 2, and a second wiring 4 of aluminum is formed on the PSG layer 3.

In the structure, it is needless to say that aluminum wirings 2 and 4 have a resistance of low value. In the shown structure, however, it is generally observed that the wiring 2 has steps 2', and because of these steps, both the PSG layer 3 and the second wiring 4 tend to be formed with steps 3' and 4' respectively as shown. In such a case, the second wiring 4 is liable to be broken at steps 3' and 4'. And thus, the wiring arrangement of FIG. 1A has a weakness in that the manufacturing yield cannot easily be improved although the value of resistance of aluminum is low.

An attempt to anneal the PSG layer 3 to smooth the steps 3' is not used in this case because, at 500° C., aluminum reacts to the PSG or silicon dioxide with which it is in contact, rendering the aluminum wiring unusable.

To improve the wiring arrangement of FIG. 1A, the aluminum wiring 2 is replaced by a silicon wiring 2a as shown in FIG. 2A. After formation of the PSG layer 3, an annealing at 1,050° C. is carried out for reflowing the PSG as shown in FIG. 2A. Aluminum wiring 4 then formed on the smoothed PSG layer 3. This avoids breaking of the wiring 4 experienced in the FIG. 1A embodiment.

And thus, the wiring arrangement of FIG. 2A results in an improved manufacturing yield, but the value of resistance of silicon wiring 2a is high compared to that of aluminum wiring 2 of FIG. 1A.

The same results are observed at contact holes formed over the electrodes 2b and 2c as shown in FIGS. 1B aND 2B. The aluminum wiring 2b in FIG. 1B is replaced by the silicon wiring 2c in FIG. 2B and the steep edge of PSG layer 3 in FIG. 1B is smoothed in FIG. 2B.

Efforts are being made to maintain a high manufacturing yield while holding down the resistance of multiple wirings to as low as possible.

In the structures shown in FIG. 2A and FIG. 2B, it is known generally that single-crystal silicon wirings are preferable to polycrystalline silicon wirings because the value of resistance of single-crystal silicon is half that of polycrystalline silicon. Furthermore, when the single-crystal silicon is turned into a metal silicide, the value of its resistance is reduced by one order. Formation of silicide wiring can be done simultaneously with the manufacture of other parts of the devide without using a separate and independent process.

Japanese Unexamined Patent Publication NO. 135583 of 1978 published on Nov. 27, 1978 discloses a method of manufacturing an insulated-gate field-effect transistor (IGFET). The method is understood to comprise the steps of: masking with a first mask a thick insulating layer on a silicon substrate to fabricate a gate, source and drain to be followed by an etching, then covering the entire surface of the substrate with a thin insulating material and polycrystalline silicon layer successively; masking with second mask the composite layer of polycrystalline silicon and thin insulating material to remove a part of the composite layer in the region where the source and drain are to be formed, to be followed by an etching; introducing impurity material into the exposed region where the source and drain are to be formed, covering the entire surface with a layer of metal for forming a silicide; forming a silicide on the polycrystalline silicon layer in the gate region to form the gate, and forming a silicide on the silicon in the source and drain forming region to form source and drain contacts, and selectively etching that part of the metal layer that has not been turned into silicide.

FIG. 3 illustrates a structure fabricated by such a method in which 11 denotes a substrate of one conductive type, 12 oxidized layers, 14 and 16 regions doped with impurity material, 15 gate electrode, 17 and 18 interconnection layers, and 19 a metal layer.

According to the disclosed method, an annealing of the structure as shown in FIG. 3 is performed, and the metal layer 19 in contact with silicon is turned into a silicide in a self-alignment fashion, and no reaction is noted in the metal layer 19 that is not in contact with silicon. There is silicide formation only at or near the area over the polycrystalline silicon electrodes 15, 17 and 18 and the surface area S where the metal layer 19 is in contact with the region 14 in the substrate 11.

If the annealing is carried out for a longer period in time for the purpose of silicide formation, the formed silicide will penetrate through the region 14. If this happens, there will be a conductive path between the metal layer 19 and the substrate 11.

Because of this, the annealing for silicide formation must be terminated at an appropriate time according to this method. This means it is difficult to regulate the extent or length of the annealing in the disclosed invention. Besides, the method cannot be repeated with certainty and the resistivity cannot be lowered sufficiently.

SUMMARY OF THE INVENTION

It is therefore a general object of this invention to offer a method to manufacture a semiconductor device provided with electrodes and wirings having a low value of resistance.

In order to attain the general object, the inventors paid attention to the fact that both single-crystal and polycrystalline silicon wirings can be completely turned into silicides resulting in wirings with low resistance if they are on insulating substrates. By silicide formation for polycrystalline silicon wiring as well as single crystal wiring, the operation speed of the device as well as the integration density is improved.

In one embodiment of the invention to achieve the object described above, silicon wiring 2a and electrode 2c of FIGS. 2A and 2B are turned into silicides such as $MoSi_2$ or $PtSi$ to obtain low value of resistance which is somewhere between values of resistance of aluminum and silicon.

More specifically, a metal film is formed on a single-crystal silicon layer on an insulating substrate such as sapphire or spinel after exposing at least one part of the silicon layer, an annealing is carried out to turn the single-crystal silicon into silicide throughout the entire thickness of the silicon layer, and removing the metal film that has not been consumed during silicide formation.

In another embodiment of the invention, the single-crystal silicon is replaced by polycrystalline silicon.

In a further embodiment of the invention, a silicon layer is formed on an insulating layer of sapphire or spinel that has been deposited on a semiconductor substrate.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike.

DESCRIPTION OF THE PREFERRED EMBODIMENT

There are illustrated in cross-sectional views of FIGS. 4 to 10 relevant parts of a semiconductor device at various stages in the manufacturing process in accordance with the method of the invention.

Figure 1A:
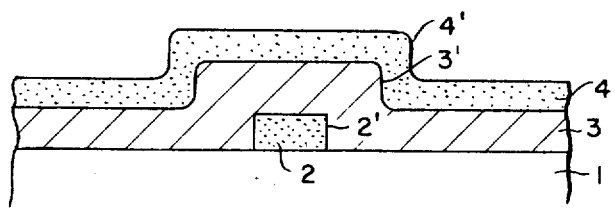
FIGS. 1A and 1B are cross-sectional views of two layer aluminum wirings and electrodes respectively according to a known method.
Figure 1B:
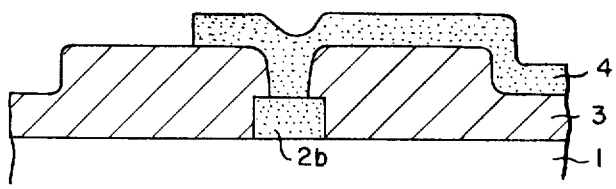
Figure 2A:
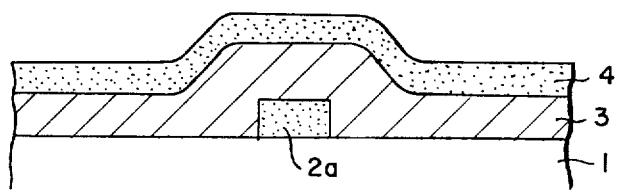
FIGS. 2A and 2B are cross-sectional views of prior art silicon/aluminum wirings and electrodes respectively.
Figure 2B:
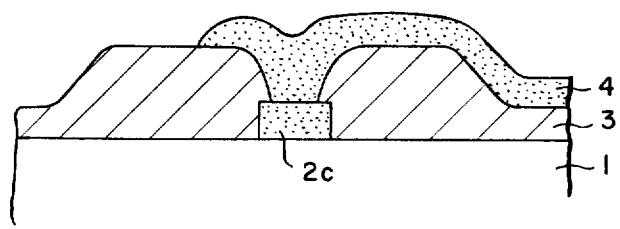
Figure 3:
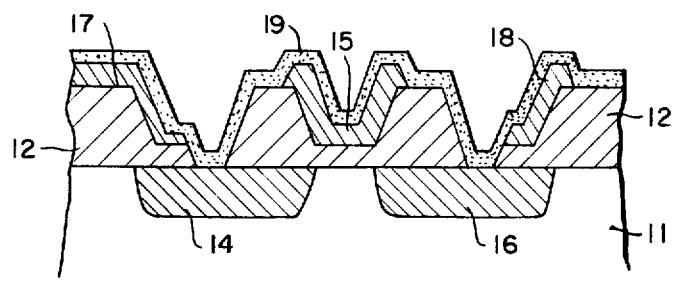
FIG. 3 is a cross-sectional view of a prior art IGFET.
Figure 4:
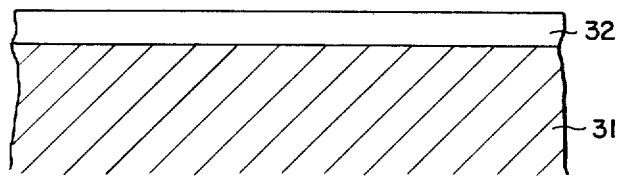
FIGS. 4 to 10 are cross-sectional views of relevant parts of a semiconductor device at various stages of manufacturing by the process according to the present method of the invention.

Referring first to FIG. 4, a layer 32 of single-crystal silicon is epitaxially grown approximately 0.6 $\mu$m thick on the surface of a single-crystal insulating substrate 31, sapphire for example.

Figure 5:
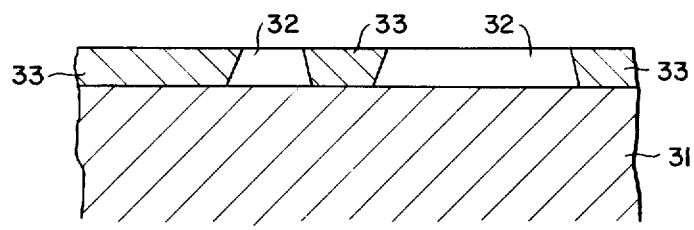

In order to isolate regions where active elements of the semiconductor device are to be fabricated, insulating films 33 are formed as shown in FIG. 5 by the known thermal process of local oxidation of silicon (LOCOS) using a mask of silicon nitride, for example.

Figure 6:
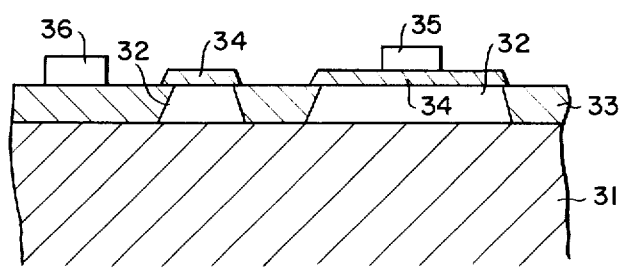

As shown in FIG. 6, an insulating film 34 approximately 500 Å thick is formed next by a conventional thermal oxidation process. The film 34 may be used as a gate insulating film of a transistor to be subsequently fabricated.

By a known chemical vapour deposition (CVD) process, a polycrystalline silicon film is grown approximately 8,000 Å thick. This film is then patterned in accordance with a known photolithography process to form silicon gate electrode 35 and wiring 36.

Figure 7:
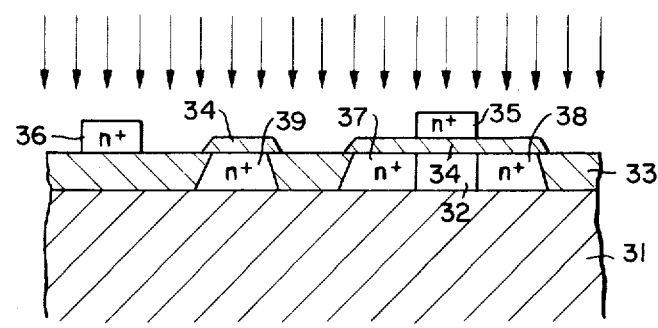

Next, as illustrated by arrows in FIG. 7, n-type impurity material such as arsenic, (As$^+$) is introduced by a known blanket ion implantation, under the energy of 150 KeV, with a dosage of $5 \times 10^{15}$ cm$^{-2}$ to form n$^+$-type source region 37 and n$^+$-type drain region 38. An n$^+$-type region 39 is used as a wiring. The gate electrode 35 and the wiring 36 are also simultaneously doped with n$^+$-type impurity material.

Figure 8:
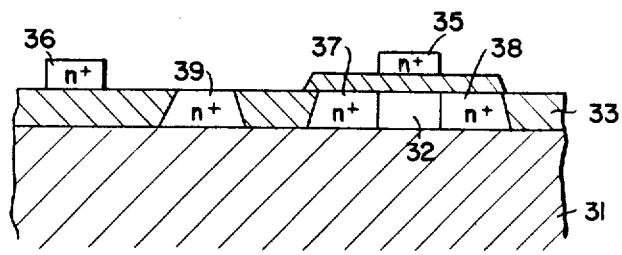

By a known photolithography process, the insulation film 34 is patterned to expose the surface of the wiring region 39 as shown in FIG. 8.

Figure 9:
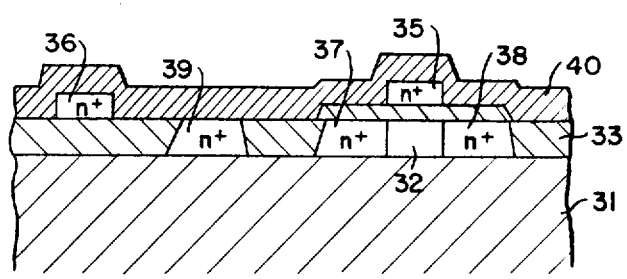

Further, by a conventional sputtering process, a molybdenum (Mo) film 40 is grown approximately 10,000 Å thick as shown in FIG. 9. In addition to Mo, metals such as titanium, platinum, nickel, magnesium, iron, hafnium, rubidium, vanadium and the like may also be used.

Then, an annealing is carried out in a nitrogen atmosphere at approximately 600° C. to turn into Mo silicide the silicon gate electrode 35, wiring 36 and wiring region 39. There is no silicide formation in any of these elements that are in contact with silicon dioxide, and only the exposed portions of the silicon layer or region are turned into silicide in a self-alignment fashion.

Referring to FIG. 9, the substrate 31 is made of an insulating material. There is a film of silicon dioxide under the electrode 35 and wiring 36 respectively. Thus, the annealing can be carried out sufficiently to form silicide throughout the entire thicknesses of the silicon films 35, 36 and 39 resulting in a lower value of resistance. This is an improvement not disclosed in the Unexamined Japanese Patent Publication No. 135583 of 1978 cited previously.

Figure 10:
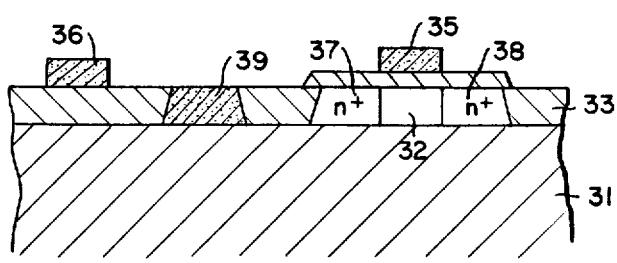

Finally, as shown in FIG. 10, a further annealing is carried out in an oxidation atmosphere of oxygen gas diluted by nitrogen gas at 300° C. to convert Mo film 40 into a film of molybdenum oxide so it will evaporate. As is generally known, molybdenum oxide is volatile and evaporates, but molybdenum silicide remains as it is.

Instead of the foregoing, Mo film 40 may be removed by a known chemical etching utilizing the difference of etching rates of Mo and MoSi$_2$ in which case dilute nitric or sulfuric acid may be used. Platinum, if used instead of Mo, may be removed by aqua regia.

Then, PSG is deposited, contact holes are opened and aluminum is evaporated and patterned to complete a semiconductor device.

In the first mentioned annealing explained before in connection with FIG. 9, if silicide formation of polycrystalline silicon on the film of silicon dioxide is partly carried out to offer a structure of silicon dioxide film-/polycrystalline silicon/MoSi$_2$, it will have a good adhesiveness to the film of silicon dioxide.

Figure 11:
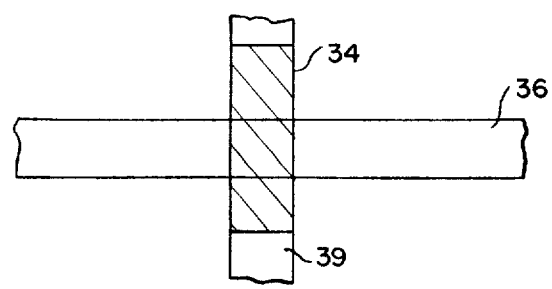
FIG. 11 is a plan view of a part of a semiconductor device manufactured according to the method of the invention.

Wiring 36 and the wiring region 39 may cross each other as shown by a plan view of FIG. 11. In such a case, the silicon dioxide film 34 on the wiring region 39 at the intersecting portion is not removed and remains there as shown by hatchings in FIG. 11. This means that the region 39 under the silicon dioxide 34 and the wiring 36 is not turned into silicide and remains as a single-crystal silicon having a higher value of resistance than that of silicide. Even in such a case, the width of the wiring 36 is usually on the order of 4 to 5 $\mu$m whereas the length of the wiring 39 is on the order of millimeters. It is true that the value of resistance in such a place is not reduced, but due to a big dimensional difference just described, the effect of no formation of silicide at the crossing of the wire 36 and 39 is negligible, and the device as a whole is affected very little.

In the embodiment of the invention that has been described so far, the layer 32 of single-crystal silicon for forming active elements such as MOS FETs, is epitaxially grown on the sapphire substrate 31. Instead, a silicon substrate having a film of silicon dioxide approximately 6,000 Å thick grown thereon may be used as the insulating substrate 31. A film of single-crystal silicon approximately 5,000 Å thick may be formed on the film of silicon dioxide for forming the active elements.

In this case, a film of polycrystalline silicon, 5,000 Å thick deposited on the film of silicon dioxide may be turned into single-crystal silicon film by a known regrowth process using laser annealing, electron beam annealing and the like.

As an alternate, a film of sapphire or spinel, 6000 Å thick, may be grown epitaxially on a single-crystal silicon substrate. Then, silicon film, 5,000 Å thick, may be epitaxially grown on the sapphire film for an active layer.

Experiments confirmed that the sheet resistance of a heavily-doped single-crystal silicon film 5,000 Å thick, is about 20 Ω/square. Where the silicon film is turned into silicide film, the sheet resistance thereof was about 3 Ω/square.

As will be understood from the foregoing description, electrode or wiring usually formed by silicon is partly exposed according to the method of the invention, and a film of metal capable of forming silicide when alloyed with silicon is formed on the electrode or wiring, then annealing is carried out. The silicon electrode or wiring is turned into silicide electrode or wiring, for example electrode or wiring of $MoSi_2$, the resistance of which is reduced considerably.

Thus, the invention having been described in its best embodiment and mode of operation, that which is claimed and desired to be protected by Letters Patent is:

1. A method of manufacturing a semiconductor device, comprising the steps of:
   (a) forming a single-crystal silicon layer on an insulating substrate;
   (b) patterning the single-crystal silicon layer to form an active element region and a first wiring region;
   (c) forming a gate insulating film on the active element region and first wiring region;
   (d) forming a polycrystalline silicon film over the insulating substrate;
   (e) patterning the polycrystalline silicon film to form both a gate electrode region except over the active element region and a second wiring region;
   (f) implanting an impurity by blanket ion implantation into the first wiring region, the second wiring region, the gate electrode region and the active element region under the gate electrode region;
   (g) removing the gate insulating film on the first wiring region;
   (h) forming a metal layer over the insulating substrate in contact with the first wiring region, the second wiring region and the gate electrode;
   (i) annealing the semiconductor device to form metal silicide regions by converting the metal layer in the first wiring region, the second wiring region and the gate electrode region into metal silicide throughout the entire thickness thereof; and
   (j) removing the metal layer remaining after the formation of the metal silicide region in the annealing step.

2. A method according to claim 1, wherein said patterning step (b) is performed using a local oxidation process.

3. A method according to claim 1, wherein said patterning step (b) is performed using a photo etching process.

4. A method according to claim 1 further comprising the step of forming a polycrystalline silicon layer on said insulating film, at least a part of the polycrystalline silicon layer being converted into a metal silicide layer throughout its entire thickness.

5. A method according to claim 1, wherein the insulating substrate comprises a single-crystal silicon substrate and a film of silicon dioxide formed on the single-crystal silicon substrate.

6. A method according to claim 1, wherein the insulating substrate comprises a single-crystal silicon substrate and a film of sapphire or spinel formed on the single-crystal silicon substrate.

7. A method as claimed in claim 1, wherein the insulating substrate comprises sapphire or spinel.

8. A method as claimed in claim 1, 5, 6, or 7, wherein the metal film is selected from a group consisting of molybdenum, titanium, platinum, nickel, magnesium, iron, hafnium, rubidium and vanadium.

* * * * *